(12) United States Patent
Lin et al.

(10) Patent No.: US 6,191,003 B1
(45) Date of Patent: Feb. 20, 2001

(54) METHOD FOR PLANARIZING A POLYCRYSTALLINE SILICON LAYER DEPOSITED ON A TRENCH

(75) Inventors: Ping-wei Lin, Chia Yi; Chien-hung Chen, Yung Ho; Jui-ping Li, Yi Lan County; Yen-jung Chang, Yung Ho, all of (TW)

(73) Assignee: Mosel Vitelic Inc., Hsinchu (TW)

( * ) Notice: Under 35 U.S.C. 154(b), the term of this patent shall be extended for 0 days.

(21) Appl. No.: 09/487,661

(22) Filed: Jan. 19, 2000

(30) Foreign Application Priority Data

Oct. 6, 1999 (TW) ................................................ 88117346

(51) Int. Cl.[7] .................................................. H01L 21/76
(52) U.S. Cl. ...................... 438/431; 438/437; 438/239; 438/692; 438/404
(58) Field of Search .................................... 438/431, 437, 438/239, 692, 243, 246, 387, 396, 404, 561, 920; 257/303, 296, 301

(56) References Cited

U.S. PATENT DOCUMENTS

| | | | |
|---|---|---|---|
| 5,411,913 | * 5/1995 | Bashir et al. | 437/64 |
| 5,854,120 | * 12/1998 | Urano et al. | 438/404 |
| 5,920,785 | * 7/1999 | Chi et al. | 438/387 |
| 5,933,748 | * 8/1999 | Chou et al. | 438/431 |
| 6,018,177 | * 1/2000 | Chi | 257/303 |
| 6,025,225 | * 2/2000 | Forbes et al. | 438/243 |

* cited by examiner

Primary Examiner—Matthew Smith
Assistant Examiner—Victor Yevsikov
(74) Attorney, Agent, or Firm—Bacon & Thomas

(57) ABSTRACT

A method for planarizing a polycrystalline silicon layer deposited on a trench, which is formed on a semiconductor substrate, comprises the following steps. First, a polycrystalline silicon layer with an enough thickness is deposited on the surface of the semiconductor substrate to overfill the trench. At least one dimple is undesirably developed on the polycrystalline silicon layer during the polycrystalline silicon deposition. Then, an oxide layer with an enough thickness is formed on the polycrystalline silicon layer to overfill the at least one dimple. Next, the polycrystalline silicon layer is partially oxidized so as to transform the upper portion thereof into a polysilicon oxide layer. As a result of a non-uniform distribution of the oxidization rate, the bottom surface of the polysilicon oxide layer, i.e. the interface between the polysilicon oxide layer and the non-oxidized portion of the polycrystalline silicon layer, is substantially planar. Finally, the oxide layer and the polysilicon oxide layer are both removed so as to expose the substantially planar polycrystalline silicon layer.

10 Claims, 3 Drawing Sheets

METHOD FOR PLANARIZING A POLYCRYSTALLINE SILICON LAYER DEPOSITED ON A TRENCH

FIELD OF THE INVENTION

The present invention relates to a method for planarizing a polycrystalline silicon layer, and more particularly to a method for planarizing a polycrystalline silicon layer deposited on a trench which is formed on a semiconductor substrate.

BACKGROUND OF THE INVENTION

In advanced semiconductor integrated circuits (ICs), a trench structure formed in a semiconductor substrate is widely used to achieve various objects. For example, the trench structure is used to form a deep trench capacitor whose capacitance increases with the increase of the longitudinal surface area of a dielectric so as to enlarge the integration of semiconductor ICs. Moreover, the trench structure is used to form a trench isolation for isolating semiconductor devices in semiconductor ICs so as to improve problems of conventional LOCOS process such as the formation of so-called bird's beaks which occupy a larger amount of the surface area of the substrate, the occurrence of a less planar surface, and so on. In addition, the trench structure is also used to form a double diffused MOS transistor (DMOS), wherein a MOS transistor is formed within a trench, for applying to high power ICs.

FIG. 1 is a cross-sectional view showing an example of a conventional trench structure. In FIG. 1, a trench 2 is formed on a semiconductor substrate 1 through the conventional photolithography and etching processes (not shown). Then, a polycrystalline silicon layer 3 is deposited on the surface of the semiconductor substrate 1 through the low pressure chemical vapor deposition (LPCVD) method so as to substantially fill the trench 2. However, when the trench 2 is filled with the polycrystalline silicon layer 3, in fact, at least one dimple 10 always occurs on the polycrystalline silicon layer 3 above the trench 2. As a result, the polycrystalline silicon layer 3 deposited on the trench 2 which is formed on the semiconductor substrate 1 has a non-planar surface.

During the sequential manufacturing steps of semiconductor ICs, the above-mentioned dimple phenomenon will cause several disadvantages such as the following:

(1) deterioration in step coverage of layers deposited on the polycrystalline silicon layer 3 such that it is difficult to perform the subsequent manufacturing steps of exposure and alignment, and the residue held in the dimple 10 after the subsequent etching process causes a problem of leakage or shortage so as to reduce the yield of the products;

(2) difficult removing of particles held in the dimple 10 resulting in the defect which reduces the yield and the reliability of the products; and (3) easy holding of an unnecessary material such as the etching solvent, the cleaning solution, etc., which causes the reduction of the reliability of the products due to the dimple 10.

SUMMARY OF THE INVENTION

It is therefore an object of the present invention to provide a method for planarizing a polycrystalline silicon layer deposited on a trench which is formed on a semiconductor substrate, thereby the dimple forming on the polycrystalline silicon layer is removed.

A method according to the first aspect of the present invention for planarizing a polycrystalline silicon layer deposited on a trench, which is formed on a semiconductor substrate, comprises the following steps: depositing a polycrystalline silicon layer on the surface of the semiconductor substrate to overfill the trench wherein at least one dimple is formed on the polycrystalline silicon layer; forming an oxide layer on the polycrystalline silicon layer wherein the oxide layer has an enough thickness so as to overfill the at least one dimple; partially oxidizing the polycrystalline silicon layer in such a way that the upper portion of the polycrystalline silicon layer is transformed into a polysilicon oxide layer whose bottom surface is higher than the opening of the trench and substantially planar; and removing the oxide layer and the polysilicon oxide layer to expose a non-oxidized portion of the polycrystalline silicon layer.

A method according to the second aspect of the present invention for planarizing a polycrystalline silicon layer deposited on a trench, which is formed on a semiconductor substrate, comprises the following steps: depositing a polycrystalline silicon layer on the surface of the semiconductor substrate to overfill the trench, wherein at least one dimple is formed on the polycrystalline silicon layer; forming an oxide layer on the polycrystalline silicon layer, wherein the oxide layer has an enough thickness so as to overfill the at least one dimple; partially the oxide layer so that only the at least one dimple is still covered with a non-etched portion of the oxide layer; partially oxidizing the polycrystalline silicon layer in such a way that the upper portion of the polycrystalline silicon layer is transformed into a polysilicon oxide layer whose bottom surface is higher than the opening of the trench and substantially planar; and removing the non-etched portion of the oxide layer and the polysilicon oxide layer to expose a non-oxidized portion of the polycrystalline silicon layer.

BRIEF DESCRIPTION OF THE DRAWINGS

The above and other objects, features, and advantages of the present invention will become more apparent from the following detailed description of embodiments in conjunction with the accompanying drawings wherein.

DETAILED DESCRIPTION OF THE PREFERRED EMBODIMENTS

The first embodiment according to the present invention will now be described in detail referring to FIGS. 2(a) to 2(c).

Figure 1:
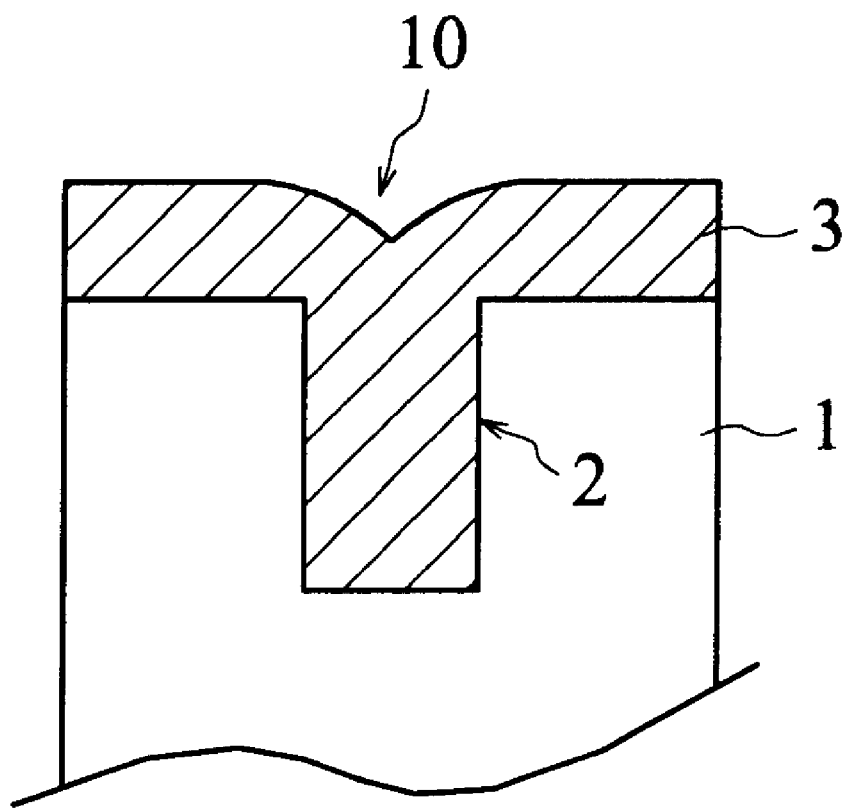
FIG. 1 is a cross-sectional view showing an example of the coventional trench structures.
Figure 2A:
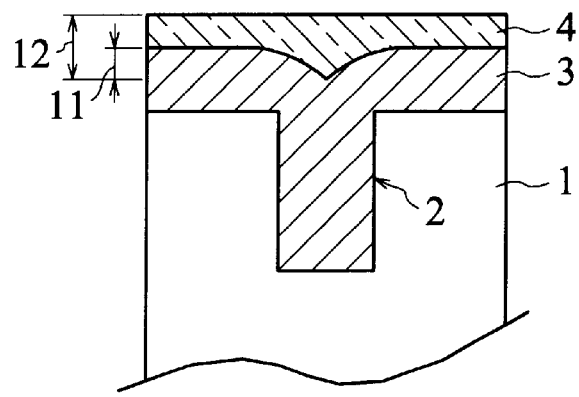
FIGS. 2(a) to 2(c) are cross-sectional views showing the manufacturing steps for planarizing the polycrystalline silicon layer according to the first embodiment of the present invention.

In FIG. 2(a), an oxide layer 4 is deposited on the polycrystalline silicon layer 3 shown in FIG. 1 through conventional chemical vapor deposition (CVD) method. It is necessary for the oxide layer 4 to have an enough thickness so as to overfill the dimple 10 formed in the polycrystalline silicon layer 3. It is noted that the surface of the oxide layer 4 is substantially planar because the oxide layer 4 deposited through CVD method has fair step coverage. However, the thickness of the oxide layer 4 deposited on the polycrystalline silicon layer 3 is non-uniform due to the dimple 10 formed on the surface of the polycrystalline silicon layer 3. In other words, the thickness of the portion of the oxide layer 4 for filling the dimple 10 is thicker than the other portion of the oxide layer 4. In the first embodiment according to the present invention, the depth 11 of the dimple 10 (i.e., the distance between the bottom of the dimple 10 and the opening of the dimple 10) is approximately 200 nm, whereas the largest thickness 12 of the oxide layer 4 (i.e., the distance between the bottom of the dimple 10 and the surface of the oxide layer 4) is approximately 300 nm. Thereafter, the polycrystalline silicon layer 3 is partially oxidized in a thermal furnace (not shown) containing an oxygen gas at a predetermined temperature such as 850° C. to 950° C. for a predetermined oxidization period which is defined by the depth 11 of the dimple 10. Because the oxygen gas must penetrate through the oxide layer 4 to interact with the polycrystalline silicon layer 3 covered by the oxide layer 4, the oxidization rate of the polycrystalline silicon layer 3 depends on the thickness of the oxide layer 4 deposited thereon. The oxidization rate of the polycrystalline silicon layer 3 is slower if the thickness of the oxide layer 4 deposited thereon is thicker. As a result, the portion of the polycrystalline silicon layer 3 which is farther away from the dimple 10 has a faster oxidization rate than the portion in the vicinity of the dimple 10.

Figure 2B:
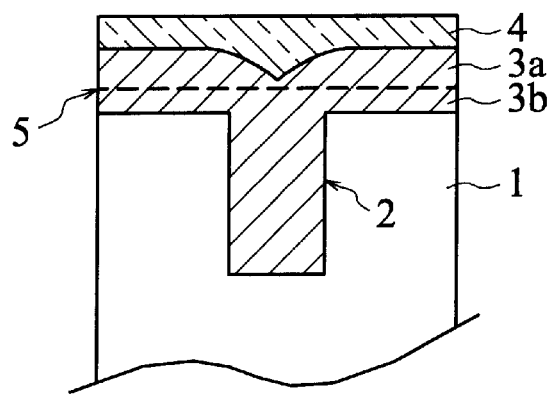

As shown in FIG. 2(b), after the above-mentioned predetermined oxidization period defined by the depth 11 of the dimple 10, the polycrystalline silicon layer 3 substantially consists of two portions: the polysilicon oxide layer 3a oxidized from the upper portion of the polycrystalline silicon layer 3 and the non-oxidized portion 3b of the polycrystalline silicon layer 3. The bottom surface of the polysilicon oxide layer 3a, i.e. the interface 5 between the polysilicon oxide layer 3a and the non-oxidized portion 3b of the polycrystalline silicon layer 3, is higher than the opening of the trench 1. Because of the above-mentioned non-uniform distribution of the oxidization rate of the polycrystalline silicon layer 3, the interface 5 between the polysilicon oxide layer 3a and the non-oxidized portion 3b of the polycrystalline silicon layer 3 is substantially planar.

Figure 2C:
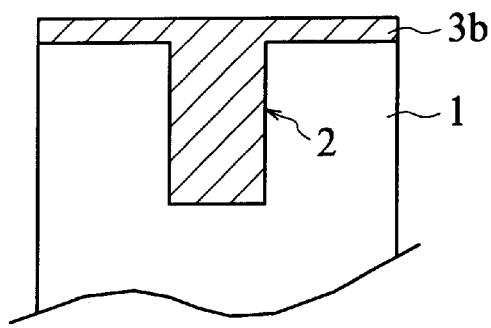

Next, referring to FIG. 2(c), the oxide layer 4 and the polysilicon oxide layer 3a are removed through the conventional wet or dry etching process. As a result, the non-oxidized portion 3b of the polycrystalline silicon layer 3 is exposed. Because the non-oxidized portion 3b of the polycrystalline silicon layer 3 has the substantially planar surface 5, the method for planarizing the polycrystalline silicon layer 3 deposited on the trench 2 according to the first embodiment of the present invention is achieved.

The second embodiment according to the present invention will now be described in detail referring to FIGS. 3(a) to 3(b).

Similar to the first embodiment according to the present invention, an oxide layer 4 is deposited on the polycrystalline silicon layer 3 through CVD method in the second embodiment according to the present invention, as shown in FIG. 2(a). It is necessary for the oxide layer 4 to have an enough thickness so as to overfill the dimple 10 formed in the polycrystalline silicon layer 3. In the second embodiment according to the present invention, the depth 11 of the dimple 10 (i.e., the distance between the bottom of the dimple 10 and the opening of the dimple 10) is approximately 200 nm, whereas the largest thickness 12 of the oxide layer 4 (i.e., the distance between the bottom of the dimple 10 and the surface of the oxide layer 4) is approximately 300 nm.

Figure 3A:
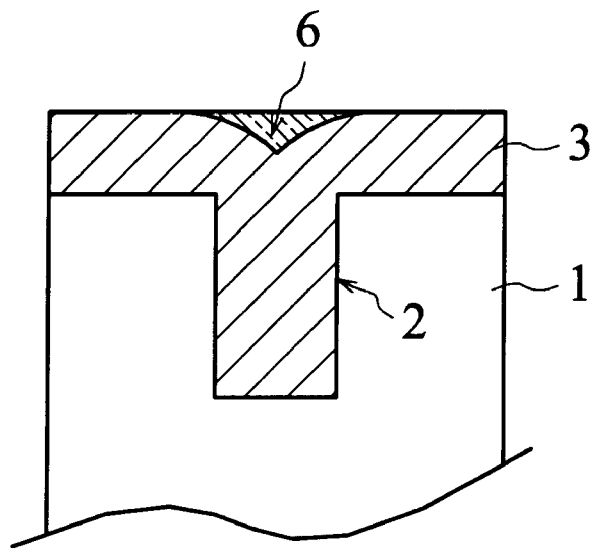
FIGS. 3(a) to 3(b) are cross-sectional views showing the manufacturing steps for planarizing the polycrystalline silicon layer according to the second embodiment of the present invention.
Figure 3B:
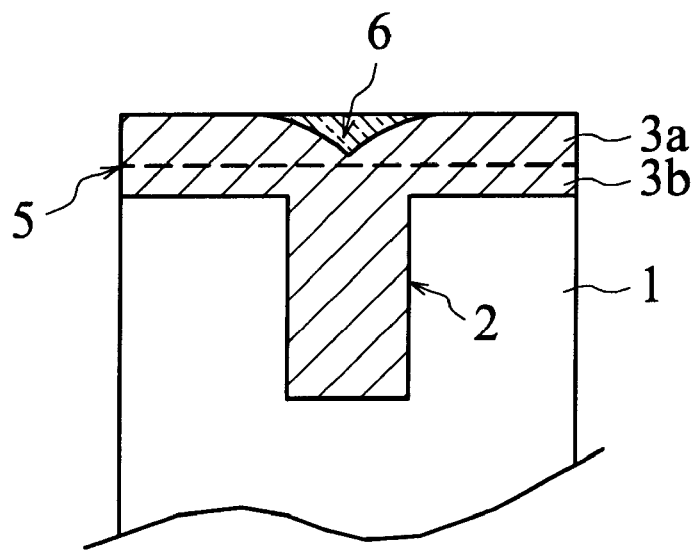

Thereafter, a portion of the oxide layer 4 is etched back through the conventional wet or dry etching process, as shown in FIG. 3(a). After the completion of the etching back process, only the dimple 10 is still covered with the non-etched portion 6 of the oxide layer 4 and the other portion of the polycrystalline silicon layer 3 is exposed. Then, the polycrystalline silicon layer 3 is partially oxidized in a thermal furnace (not shown) containing an oxygen gas at a predetermined temperature such as 850° C. to 950° C. for a predetermined oxidization period which is defined by the depth 11 of the dimple 10. Because the dimple 10 is covered with the non-etched portion 6 of the oxide layer 4, the oxygen gas must penetrate through the non-etched portion 6 to interact with the polycrystalline silicon layer 3 covered by the non-etched portion 6. As a result, in the second embodiment according to the present invention, the oxidization rate of the polycrystalline silicon layer 3 is also location-dependent. In other words, the oxidization rate of the portion, covered by the non-etched portion 6 of the oxide layer 4, of the polycrystalline silicon layer 3 is slower than that of the other portion not covered by the non-etched portion 6. More specifically, the oxidization rate of the portion, at the center of the dimple 10, of the polycrystalline silicon layer 3 is the slowest, that of the portion at the edge of the dimple 10 is faster, and that of the other portion not covered by the non-etched portion 6 is the fastest. As shown in FIG. 3(b), after the above-mentioned predetermined oxidization period defined by the depth 11 of the dimple 10, the polycrystalline silicon layer 3 substantially consists of two portions: the polysilicon oxide layer 3a oxidized from the upper portion of the polycrystalline silicon layer 3 and the non-oxidized portion 3b of the polycrystalline silicon layer 3. The bottom surface of the polysilicon oxide layer 3a, i.e. the interface 5 between the polysilicon oxide layer 3a and the non-oxidized portion 3b of the polycrystalline silicon layer 3, is higher than the opening of the trench 2. Because of the above-mentioned non-uniform distribution of oxidization rate of polycrystalline silicon layer 3, the interface 5 between the polysilicon oxide layer 3a and the non-oxidized portion 3b of the polycrystalline silicon layer 3 is substantially planar.

Next, similar to the first embodiment according to the present invention, the non-etched portion 6 of the oxide layer 4 and the polysilicon oxide layer 3a are removed through the conventional wet or dry etching process in the second embodiment according to the present invention. As a result, the non-oxidized portion 3b of the polycrystalline silicon layer 3 is exposed. Because the non-oxidized portion 3b of the polycrystalline silicon layer 3 has the substantially planar surface 5, the method for planarizing the polycrystalline silicon layer 3 deposited on the trench 2 according to the second embodiment of the present invention is achieved.

In summary, the present invention has disclosed a method for planarizing a polycrystalline silicon layer deposited on a trench. It is easy to carry out the method according to the present invention and it is effective to remove a dimple on the surface of the polycrystalline silicon layer such that the surface of the polycrystalline silicon layer becomes substantially planar.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for planarizing a polycrystalline silicon layer deposited on a trench, which is formed on a semiconductor substrate, comprising the following steps:

depositing a polycrystalline silicon layer on the surface of said semiconductor substrate to overfill said trench, wherein at least one dimple is formed on said polycrystalline silicon layer;

forming an oxide layer on said polycrystalline silicon layer, wherein said oxide layer has an enough thickness so as to overfill said at least one dimple;

partially oxidizing said polycrystalline silicon layer in such a way that the upper portion of said polycrystalline silicon layer is transformed into a polysilicon oxide layer whose bottom surface is higher than the opening of said trench and substantially planar; and removing said oxide layer and said polysilicon oxide layer to expose a non-oxidized portion of said polycrystalline silicon layer.

2. A method according to claim 1, wherein said at least one dimple is located above said trench.

3. A method according to claim 1, wherein said oxide layer is formed on said polycrystalline silicon through chemical vapor deposition (CVD) method.

4. A method according to claim 1, wherein the surface of said oxide layer is substantially planar.

5. A method according to claim 1, wherein the interface between said polysilicon oxide layer and said non-oxidized portion of said polycrystalline silicon layer is substantially planar.

6. A method for planarizing a polycrystalline silicon layer deposited on a trench, which is formed on a semiconductor substrate, comprising the following steps:

depositing a polycrystalline silicon layer on the surface of said semiconductor substrate to overfill said trench, wherein at least one dimple is formed on said polycrystalline silicon layer;

forming an oxide layer on said polycrystalline silicon layer, wherein said oxide layer has an enough thickness so as to overfill said at least one dimple;

partially etching said oxide layer so that only said at least one dimple is still covered with a non-etched portion of said oxide layer;

partially oxidizing said polycrystalline silicon layer in such a way that the upper portion of said polycrystalline silicon layer is transformed into a polysilicon oxide layer whose bottom surface is higher than the opening of said trench and substantially planar; and removing said non-etched portion of said oxide layer and said polysilicon oxide layer to expose a non-oxidized portion of said polycrystalline silicon layer.

7. A method according to claim 6, wherein said at least one dimple is located above said trench.

8. A method according to claim 6, wherein said oxide layer is formed on said polycrystalline silicon through chemical vapor deposition (CVD) method.

9. A method according to claim 6, wherein the surface of said oxide layer is substantially planar.

10. A method according to claim 6, wherein the interface between said polysilicon oxide layer and said non-oxidized portion of said polycrystalline silicon layer is substantially planar.

* * * * *